United States Patent
Spierings

[11] 3,967,144
[45] June 29, 1976

[54] HALL-VOLTAGE DEVICE

[76] Inventor: Ferdinand Hubert Franciscus Gerardus Spierings, Asserpark 11, Wageningen, Netherlands

[22] Filed: May 19, 1975

[21] Appl. No.: 579,084

[52] U.S. Cl. ............................. 310/10; 310/11; 310/DIG. 3; 324/45
[51] Int. Cl.² .............................................. G21D 7/02
[58] Field of Search ............. 310/2, 10, 11, DIG. 3; 338/32 H; 324/45; 73/61.4

[56] References Cited
UNITED STATES PATENTS

| | | | |
|---|---|---|---|
| 3,663,843 | 5/1972 | Smith | 310/10 |
| 3,751,691 | 8/1973 | Ellis, Jr. | 310/DIG. 3 |
| 3,823,333 | 7/1974 | Spierings | 310/11 |
| 3,824,455 | 7/1974 | Levitt et al. | 324/45 X |
| 3,835,376 | 9/1974 | Kataoka | 324/45 X |

*Primary Examiner*—Donovan F. Duggan
*Attorney, Agent, or Firm*—Roylance, Abrams, Berdo & Kaul

[57] ABSTRACT

A Hall-voltage device in which a rotatable box is disposed in the air gap of a magnetic circuit. The box is arranged to receive a fluid having charged particles distributed therein, which fluid can cooperate with electrodes. One end face of the box is provided with an aperture through which a thin, flexible disc of plastic foil, which serves as the electrode support and has a radial cut, can be inserted into the box. The disc is provided with electrodes and associated discharge conductors and can be fixed in the box by means of a pivot extending through the aperture, which pivot includes terminals to which the discharge conductors extend.

5 Claims, 4 Drawing Figures

HALL-VOLTAGE DEVICE

The invention relates to a Hall-voltage device comprising means included in a magnetic circuit for generating a magnetic field, in the air gap of which magnetic circuit a cylindrical box is disposed substantially parallel to the planar boundaries of the air gap, which box is arranged to receive a fluid having charged particles distributed therein and which box includes electrodes adapted to cooperate with the fluid, and means for imparting to the box a rotational movement about its axis, which axis substantially coincides with the central axis of the magnetic circuit, one end face of the box being provided with a central aperture.

Such a device is disclosed in Dutch Pat. application No. 73,12639.

It is an object of the invention to provide a support for the electrodes of a device of the above type while utilizing the central aperture present in one end face of the box, which support renders it possible to equip the box, in a highly simple manner, both with one chamber and with two chambers so as to provide arrangements which are known per se from Dutch Pat. application No. 71,11003.

To achieve this object, the device according to the invention includes an electrode support consisting of a thin, flexible disc of plastic foil of a diameter slightly less than the inside diameter of the box, on which disc both the electrodes and their discharge conductors are disposed and which disc includes a radial cut so as to permit insertion of the disc into the box through the central aperture, the disc being kept in its proper position within the box by means of a pivot extending through the aperture and having terminals to which the discharge conductors extend.

The invention will be described in detail hereinafter with reference to the drawing, in which.

Figure 1:
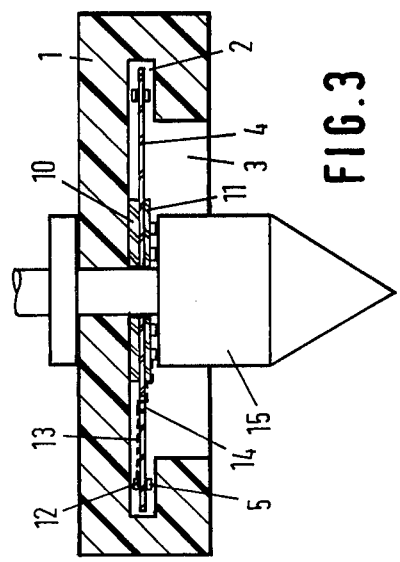
FIG. 1 shows a cross-section of a device according to the invention having one chamber.

FIG. 1 shows the rotatable section of a Hall-voltage device as described in its totality in the above Dutch Pat. application No. 71,11003. This rotatable section comprises a box 1 including a cavity 2 and having a central aperture 3 in one end face (the bottom face in the drawing).

As described in the above Dutch Pat. application No. 73,12639, this central aperture 3 may be utilized for introducing the fluid to be examined into the cavity 2 of the box 1 in a simple manner.

It has now appeared that this central aperture 3 may be used to advantage, moreover, when the electrodes of the device are not mounted on the box 1, as described in Dutch Pat. application No. 71,11003, but are disposed on an electrode support 4 consisting of a thin, flexible disc of plastic foil.

Figure 2:
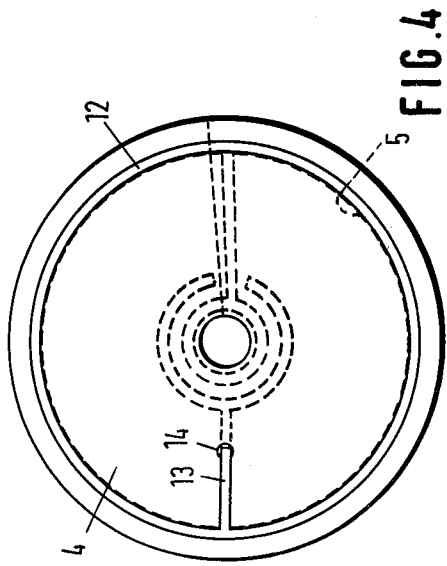
FIG. 2 shows a bottom view of the electrode support included in the device shown in FIG. 1.

FIG. 2 shows the manner in which the electrodes 5 and 6 and the associated discharge conductors 7 and 8, respectively, are disposed on this disc 4 in the device shown in FIG. 1.

In the device shown in FIG. 1 the disc 4 is placed against the bottom face of the top of the box 1, the disc 4 being kept in this position by means of the pivot 15 of the device.

The presence of the central aperture 3 in the box 1 permits disc 4 to be placed in its proper position within the box in a particularly simple manner when this disc is provided with a radial cut, as indicated by the dotted line 9 in FIG. 2, the disc is folded to form a cone, and the thus-folded disc is inserted into the box 1 through aperture 3, after which the disc is allowed to spread out and is subsequently pressed against the bottom face of the top of the box 1 by means of the pivot 15. It will be clear that in the inoperative condition of the device the disc 4 will not assume the position shown in FIG. 1 due to the fact that it consists of a thin plastic foil, but that in the operative condition of the device with the box rotating at a high speed the disc 4 will be essentially horizontal due to the resultant centrifugal force.

Figure 3:
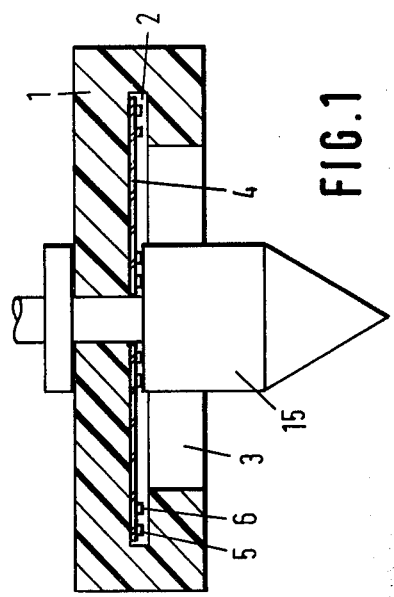
FIG. 3 shows a cross-section of a device according to the invention having two chambers.

In another embodiment of the invention the electrode support may be used to advantage when the cavity 2 of the box 1 is to be divided into two chambers to provide an arrangement which is known from Dutch Pat. application No. 73,12639. Instead of using a separate partition in cavity 2 of box 1, like in the prior device, in accordance with the invention the electrode support, i.e. the disc 4, may be used as this partition. Such an arrangement is shown in FIG. 3. This arrangement again includes the box 1 having cavity 2 and central aperture 3 through which the pivot 15 extends.

In this two-chamber structure an insulating disc 10 is provided between disc 4 and the bottom face of the top of box 1. A similar insulating disc is provided between disc 4 and the top face of pivot 15.

Figure 4:
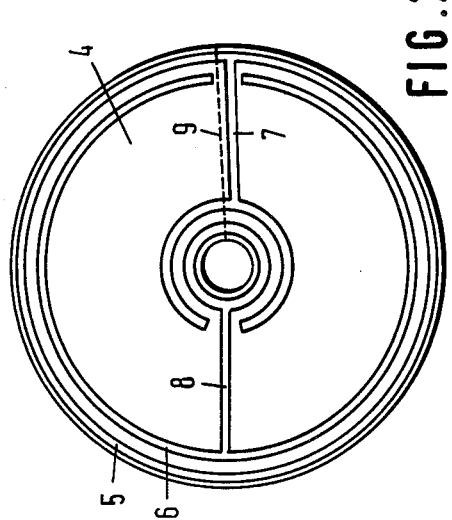
FIG. 4 shows a top view of the electrode support included in the device shown in FIG. 3.

Similar to the embodiment described above, the electrode 5 is disposed on electrode support 4 in the manner shown in FIGS. 1 and 2 and is associated with a discharge conductor. The other electrode 12, which is comparable to electrode 6 of FIGS. 1 and 2, is disposed on the opposite face of disc 4, as indicated in FIGS. 3 and 4. This electrode 12 is associated with a discharge conductor 13 which, as regarded in FIG. 3, partly extends on the top face of disc 4, passes through an opening 14 to the bottom face of the disc and subsequently extends in a manner as elucidated with reference to FIGS. 1 and 2.

It will be clear that in this manner a structure is achieved which is comparable to the two-chamber structure disclosed in the above Dutch Pat. application No. 73,12639 and which operates in the same manner as described in this application No. 73,12639.

It is observed that the electrodes and the associated discharge conductors may be provided on disc 4 in a simple manner, for example by means of silver paint, after which the electrodes are electrolytically treated with HCl to form an AgCl layer on their surfaces so as to achieve reversible electrodes. It will be clear that the insulating discs 10 and 11 may either be fixedly connected to the disc 4 or may be loose therefrom.

It will further be clear that a small part of the outermost of the two annular portions of the discharge conductors disposed on the top face of the pivot is deleted and/or coated with an insulating layer so as to ensure that there is no conductive contact between the outermost annular portion in question and the discharge conductor 8.

I claim:

1. A Hall-voltage device comprising means included in a magnetic circuit for generating a magnetic field, in the air gap of which magnetic circuit a cylindrical box is disposed substantially parallel to the planar boundaries of the air gap, which box is arranged to receive a fluid having charged particles distributed therein and which box includes electrodes adapted to cooperate with the fluid, and means for imparting to the box a rotational movement about its axis, which axis substantially coincides with the central axis of the magnetic circuit, one end face of the box being provided with a central aperture, characterized by an electrode support consisting of a thin, flexible disc of plastic foil of a diameter slightly less than the inside diameter of the box, on which disc both the electrodes and their discharge conductors are disposed and which disc includes a raidal cut so as to permit insertion of the disc into the box through the central aperture, the disc being kept in its proper position within the box by means of a pivot extending through the aperture and having terminals to which the discharge conductors extend.

2. A Hall-voltage device according to claim 1, characterized in that the disc rests directly against the bottom face of the top of the box.

3. A Hall-voltage device according to claim 1, characterized in that a disc of electrically insulating material is disposed both between the disc and the bottom face of the top of the box and between the disc and the top face of the pivot.

4. A Hall-voltage device according to claim 2, characterized in that both the electrodes and the discharge conductros extend on the face of the disc adjacent to the aperture.

5. A Hall-voltage device according to claim 3, characterized in that one electrode and the associated discharge conductor extend on the face of the disc adjacent to the aperture and that the other electrode and part of the associated discharge conductor extend on the opposite face of the disc, the other part of said discharge conductor passing through an opening in the disc to the first-named face of the disc to essentially extend thereon.

* * * * *